US011581880B2

(12) United States Patent
Binet et al.

(10) Patent No.: US 11,581,880 B2
(45) Date of Patent: Feb. 14, 2023

(54) OSCILLATOR (71) Applicant: STMicroelectronics (Rousset) SAS, Rousset (FR)

(72) Inventors: Vincent Binet, Aix en Provence (FR); Michel Cuenca, Septemes les Vallons (FR); Ludovic Girardeau, Pourrieres (FR)

(73) Assignee: STMicroelectronics (Rousset) SAS, Rousset (FR)

( * ) Notice: Subject to any disclaimer, the term of this patent is extended or adjusted under 35 U.S.C. 154(b) by 0 days.

(21) Appl. No.: 17/524,306

(22) Filed: Nov. 11, 2021

(65) Prior Publication Data

US 2022/0166415 A1 May 26, 2022

(30) Foreign Application Priority Data

Nov. 24, 2020 (FR) ........................... 2012048

(51) Int. Cl.
*H03K 4/50* (2006.01)
*H03K 5/24* (2006.01)

(52) U.S. Cl.
CPC ............. *H03K 4/50* (2013.01); *H03K 5/24* (2013.01)

(58) Field of Classification Search
CPC .......... H03K 4/50; H03K 4/501; H03K 4/502; H03K 5/24
USPC ......................... 327/131, 132, 135, 137, 138
See application file for complete search history.

(56) References Cited

U.S. PATENT DOCUMENTS 10,461,724 B2 * 10/2019 Hurwitz .................. H03B 1/00
2018/0145665 A1 5/2018 Hurwitz et al.
2019/0386615 A1 * 12/2019 Kim ..................... H03K 3/0231

FOREIGN PATENT DOCUMENTS

WO 2015191000 A1 12/2015

OTHER PUBLICATIONS

INPI Search Report and Written Opinion for FR 2012048 (which is the FR priority of the instant US filing), dated Aug. 18, 2021 (13 pages).
Lu Yangyang et al: "A high linearity current-controlled CMOS relaxation oscillator with frequency self-calibration technique", Analog Integrated Circuits and Signal Processing, Springer New York LLC, US, vol. 92, N° 1, Apr. 19, 2017 (Apr. 19, 2017), pp. 29-37, XP036245595.

* cited by examiner

*Primary Examiner* — William Hernandez
(74) *Attorney, Agent, or Firm* — Crowe & Dunlevy

(57) ABSTRACT

Series of first ramps and second ramps are generated. A circuit delivers a first signal representative of the comparison of each first ramp with a set point and delivers a second signal representative of the comparison of each second ramp with the set point. Based on the first and second signals: a first ramp is stopped and a second ramp is started when the first ramp reaches the set point, and a second ramp is stopped and a first ramp is started when the second ramp reaches the set point. The value of the set point is modulated in response a maximum value of the first/second last ramp compared with the set point.

17 Claims, 4 Drawing Sheets

OSCILLATOR

PRIORITY CLAIM

This application claims the priority benefit of French Application for Patent No. 2012048, filed on Nov. 24, 2020, the content of which is hereby incorporated by reference in its entirety to the maximum extent allowable by law.

TECHNICAL FIELD

The present disclosure generally concerns electronic circuits and, more specifically, oscillators.

BACKGROUND

Oscillators configured to generate a binary periodic signal, for example, a clock signal, are known. These oscillators use a comparison of at least one voltage ramp with a set point voltage to generate the periodic signal, with the slope of the ramp(s) and the set point voltage determining the frequency of the generated periodic signal. The comparison(s) are respectively implemented by one or a plurality of voltage comparators, typically comparator-assembled operational amplifiers.

However, the propagation time in the comparators is sensitive to temperature variations of the oscillator. So, a modification of the oscillator temperature will result in a modification of the frequency of the generated periodic signal, which is not desirable.

There is a need to overcome all or part of the disadvantages of known oscillators, in particular of the previously-described known oscillators.

SUMMARY

An embodiment overcomes all or part of the disadvantages of known oscillators, particularly of the previously-described known oscillators.

For example, an embodiment overcomes all or part of the disadvantages of known oscillators linked to the temperature variations of these oscillators.

An embodiment provides a device comprising: a first generator of a series of first voltage ramps and a second generator of a series of second voltage ramps; a first circuit configured to compare each first ramp in the series with a set point voltage, to compare each second ramp in the series with the set point voltage, to deliver a first binary signal representative of the comparison of the first ramp with the set point voltage, and to deliver a second binary signal representative of the comparison of the second ramp with the set point voltage; a second circuit configured, based on the first and second signals, to: stop a first ramp and start a second ramp when said first ramp reaches the set point voltage, and stop a second ramp and start a first ramp when said second ramp reaches the set point voltage; and a third circuit configured to modulate the set point voltage based on a maximum value of at least the last first ramp compared with the set point voltage.

According to an embodiment, the second circuit is further configured to reset the first generator between every two first successive ramps in the series, and to reset the second generator between every two second successive ramps in the series.

According to an embodiment: the first generator comprises a first capacitive element, a first switch, and a first current source series-connected between a node of application of a power supply voltage and a node of application of a reference potential, and a second switch connected in parallel with the first capacitive element; and the second generator comprises a second capacitive element, a third switch, and a second current source series-connected between the node of application of the power supply voltage and the node of application of the reference potential, and a fourth switch connected in parallel with the second capacitive element, the second circuit being configured based on the first and second signals, to: turn on the first switch and turn off the third switch when a second ramp reaches the set point voltage; and turn on the third switch and turn off the first switch when a first ramp reaches the set point voltage.

According to an embodiment, the first generator is reset by the turning-on of the second switch, the second generator being reset by the turning-on of the fourth switch, the second circuit being configured to control the second and fourth switches based on the first and second signals.

According to an embodiment, the third circuit is configured to generate a third signal representative of a difference between a reference voltage and the maximum value of at least said last first ramp, and to deliver the set point voltage equal to the reference voltage minus said difference.

According to an embodiment, the third circuit comprises a fourth circuit configured to update and then store a first voltage representative of the maximum value of each first ramp, between the end of each first ramp and a next resetting of the first generator, the second circuit being configured to control the storage and then the update based on the first and second signals.

According to an embodiment: the fourth circuit comprises a series association of a capacitive element and of a switch, said association being connected in parallel with the first capacitive element and the first voltage being available across said capacitive element; the first voltage being updated by the turning-on of said switch and stored by the turning-off of said switch; and the second circuit is configured to control the switch of the third circuit based on the first and second signals.

According to an embodiment, the third circuit comprises an error amplifier having a first input configured to receive a signal representative of the reference voltage, a second input configured to receive the first voltage, and an output terminal configured to deliver the third signal.

According to an embodiment, the second circuit is configured to modulate the set point voltage based on the maximum value of at least the last first ramp compared with the set point voltage and on a maximum value of at least the last second ramp compared with the set point voltage.

According to an embodiment, the second circuit is configured to generate a third signal alternately representative of a first difference between a reference voltage and the maximum value of at least said last first ramp and of a second difference between the reference voltage and the maximum value of at least said last second ramp, and to deliver the set point voltage alternately equal to the reference voltage minus the first difference and to the reference voltage minus the second difference.

According to an embodiment: the third circuit comprises a fourth circuit configured to update and store a first voltage representative of the maximum value of each first ramp, between the end of each first ramp and a next resetting of the first generator; the third circuit comprises a fifth circuit configured to update and store a second voltage representative of the maximum value of each second ramp, between the end of each second ramp and a next resetting of the second generator; and the second circuit is configured to control the storages and the updates based on the first and second signals.

According to an embodiment: the fourth circuit comprises a first series association of a capacitive element and of a switch, said first association being connected in parallel with the first capacitive element, the first voltage being available across the capacitive element of the fourth circuit, the first voltage being updated by the turning-on of said switch and stored by the turning-off of said switch; the fifth circuit comprises a second series association of a capacitive element and of a switch, said second association being connected in parallel with the second capacitive element, the second voltage being available across the capacitive element of the fifth circuit, the second voltage being updated by the turning-on of said switch and stored by the turning-off of said switch; and the second circuit is configured to control the switches of the fourth and fifth circuits based on the first and second signals.

According to an embodiment, the third circuit comprises: a first commutator having an input terminal configured to receive the first voltage, another input terminal configured to receive the second voltage; and an error amplifier having a first input configured to receive a signal representative of the reference voltage, a second input coupled to an output terminal of the first commutator, and an output terminal configured to deliver the third signal, the first commutator being controlled by the second circuit based on the first and second signals.

According to an embodiment, the third circuit comprises a circuit for storing the reference voltage comprising: a capacitive element and a first switch coupling a node for delivering the reference voltage to a terminal of said capacitive element, the other terminal of said capacitive element being coupled to the second node; another capacitive element and a second switch coupling a node of connection between said capacitive element and said first switch to a terminal of said other capacitive element, another terminal of said other capacitive element being coupled to said second node and being configured to deliver said signal representative of the reference voltage; and the second circuit is configured to control the first and second switches of the storage circuit based on the first and second signals.

According to an embodiment, said other terminal of said other capacitive element is coupled to the first input of the error amplifier by a second commutator, the second circuit being configured to control the second commutator similarly to the first commutator.

According to an embodiment, the third circuit comprises a third current source and a resistor series-connected between the first and second nodes, and a transistor connected in parallel with the resistor, a control terminal of the transistor being configured to receive the first signal.

BRIEF DESCRIPTION OF THE DRAWINGS

The foregoing features and advantages, as well as others, will be described in detail in the following description of specific embodiments given by way of illustration and not limitation with reference to the accompanying drawings, in which.

DETAILED DESCRIPTION

Like features have been designated by like references in the various figures. In particular, the structural and/or functional features that are common among the various embodiments may have the same references and may dispose identical structural, dimensional and material properties.

For the sake of clarity, only the steps and elements that are useful for an understanding of the embodiments described herein have been illustrated and described in detail. In particular, the different current electronic circuits where an oscillator may be provided, particularly to generate a clock signal, have not been detailed, the described embodiments and variants being compatible with such current electronic circuits.

Unless indicated otherwise, when reference is made to two elements connected together, this signifies a direct connection without any intermediate elements other than conductors, and when reference is made to two elements coupled together, this signifies that these two elements can be connected or they can be coupled via one or more other elements.

In the following disclosure, unless otherwise specified, when reference is made to absolute positional qualifiers, such as the terms "front", "back", "top", "bottom", "left", "right", etc., or to relative positional qualifiers, such as the terms "above", "below", "upper", "lower", etc., or to qualifiers of orientation, such as "horizontal", "vertical", etc., reference is made to the orientation shown in the figures.

Unless specified otherwise, the expressions "around", "approximately", "substantially" and "in the order of" signify within 10%, and preferably within 5%.

Figure 1:
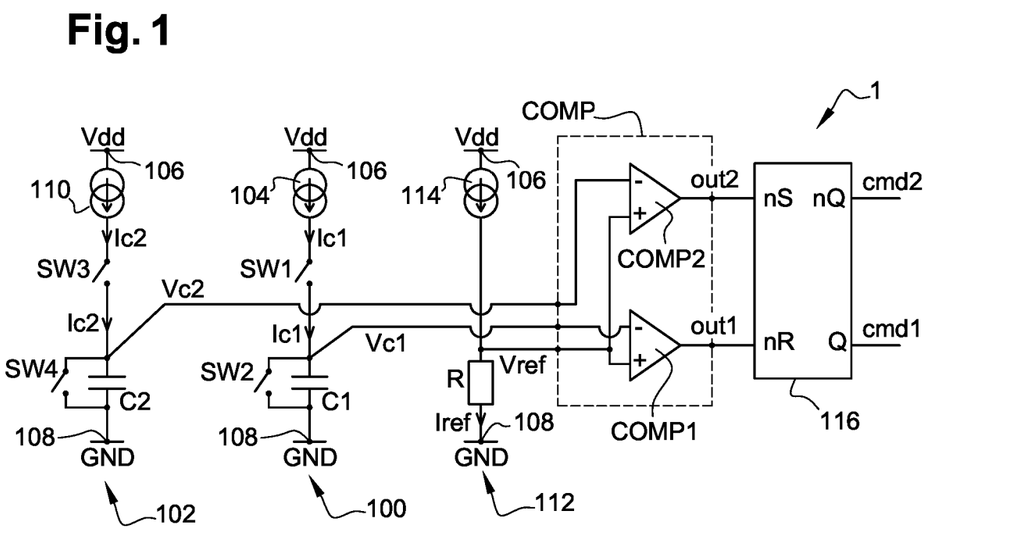
FIG. 1 shows an example of a circuit of an oscillator.

FIG. 1 shows an example of a circuit of an oscillator 1.

Oscillator 1 comprises a generator 100 of a voltage ramp Vc1 (comprising a series of ramps) and a generator 102 of a voltage ramp Vc2 (comprising a series of ramps).

Figure 2:
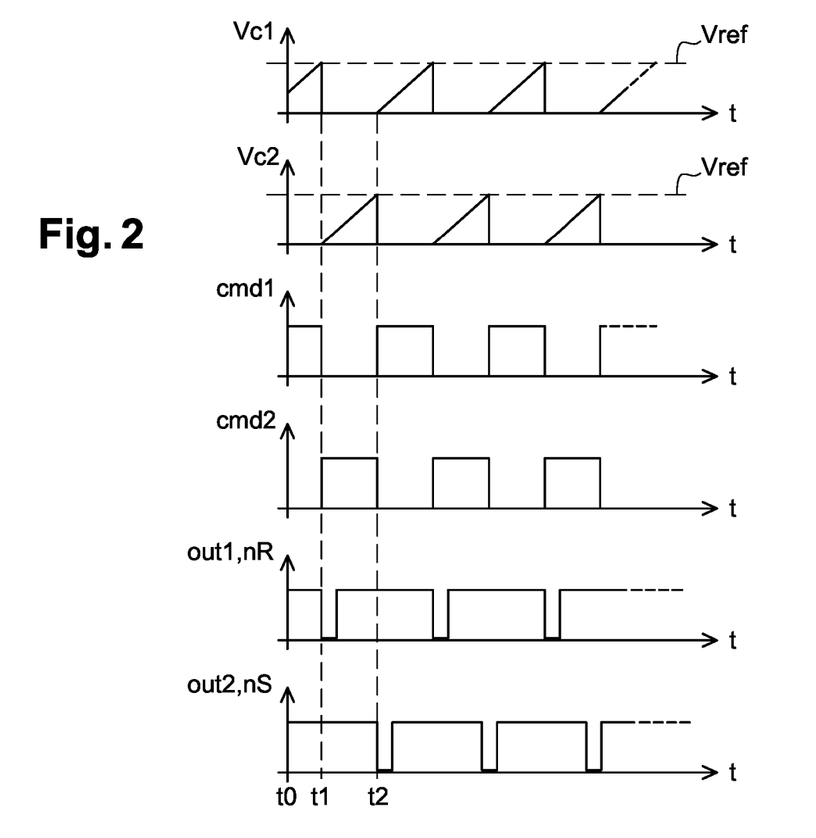
FIG. 2 shows timing diagrams illustrating the ideal operation of the oscillator of FIG. 1.

Generator 100 comprises a current source 104, a switch SW1, and a capacitive element C1 in series, preferably in this order, between a node 106 of application of a power supply voltage Vdd and a node 108 of application of a reference potential, here ground GND. Switch SW1 couples current source 104 to capacitive element C1. In the example, power supply voltage Vdd is positive and referenced to node 108 set to ground potential GND. Generator 100 further comprises a switch SW2 in parallel with capacitive element C1. Current source 104 delivers a constant current Ic1. In this example, when switch SW1 is on and switch SW2 is off, capacitive element C1 charges, which results in a voltage ramp Vc1 across capacitive element C1, as can be seen in FIG. 2. When switch SW2 is turned on, generator 100 is reset or, in other words, voltage Vc1 is reset, in this example to 0 V.

Similarly, generator 102 comprises a current source 110, a switch SW3, and a capacitive element C2 in series, preferably in this order, between the two nodes 106 and 108. Switch SW3 coupling current source 110 to capacitive element C2. Preferably, the value of capacitive element C2 is identical to that of capacitive element C1. Generator 102 further comprises a switch SW4 in parallel with capacitive element C2. Current source 110 delivers a constant current Ic2, preferably of same value Ic as current Ic1. In this example, when switch SW3 is turned on and switch SW4 is turned off, capacitive element C2 charges, which results in a voltage ramp Vc2 across capacitive element C2, as can be seen in FIG. 2. When switch SW4 is turned on, generator 102 is reset or, in other words, voltage Vc2 is reset, in this example to 0 V.

A set point or reference voltage Vref is delivered by a voltage generator 112. In this example, generator 112 comprises a current source 114 delivering a constant current Iref, and a resistor R in series with source 114 between nodes 106 and 108. Voltage Vref then corresponds to the voltage across resistor R, voltage Vref being, in this example, referenced to node 108 having a terminal of resistor R coupled thereto.

Oscillator 1 further comprises a comparing circuit COMP (delimited by dotted lines in FIG. 1) configured to compare voltage Vc1 with set point voltage Vref and to compare voltage Vc2 with set point voltage Vref. Circuit COMP is further configured to deliver a binary signal out1 having its high or low state indicating the result of the comparison of voltage Vc1 with voltage Vref, and to deliver a binary signal out2 having its high or low state indicating the result of the comparison of voltage Vc2 with voltage Vref. Circuit COMP, for example, comprises three inputs receiving respective voltages Vref, Vc1, and Vc2.

In the example of FIG. 1, circuit COMP is implemented by a comparator COMP1 and a comparator COMP2, comparators COMP1 and COMP2 being preferably identical.

Comparator COMP1 is configured to compare voltage Vc1 with set point voltage Vref and to deliver signal out1. In this example, an inverting input (−) of comparator COMP1 receives voltage Vc1, and a non-inverting input (+) of comparator COMP1 receives voltage Vref.

Similarly, comparator COMP2 is configured to compare voltage Vc2 with voltage Vref and to deliver signal out2. In this example, an inverting input (−) of comparator COMP2 receives voltage Vc2, and a non-inverting input (+) of comparator COMP1 receives voltage Vref.

Oscillator 1 further comprises a control circuit 116. Circuit 116 is configured, based on signals out1 and out2, to stop a voltage ramp Vc1 and start a voltage ramp Vc2 when voltage ramp Vc1 reaches voltage Vref, and to stop a voltage ramp Vc2 and start a voltage ramp Vc1 when voltage ramp Vc2 reaches voltage Vref.

In this example, control circuit 116 is a RS latch having an input nR receiving signal out1, an input nS receiving signal out2, an output nQ delivering a signal cmd2 for controlling switches SW2 and SW3, and an output Q delivering a signal cmd1 for controlling switches SW1 and SW4. In this example, the RS latch is configured to set signal cmd1 to the high state and signal cmd2 to the low state when signal out2 switches to the low state while signal out1 is in the high state, and to set signal cmd2 to the high state and signal cmd1 to the low state when signal out1 switches to the low state while signal out2 is in the high state. In this example, switches SW1, SW2, SW3, and SW4 are off when their respective control signals are in the low state, and on when their respective control signals are in the high state.

FIG. 2 shows timing diagrams illustrating the ideal operation of the oscillator of FIG. 1. More particularly, FIG. 2 shows timing diagrams of voltages Vc1 and Vc2 (each showing a series of voltage ramps) and of signals cmd1, cmd2, out1, and out2, signals out1 and out2 corresponding to the signals received by the respective nR and nS inputs of the RS latch 116 described in relation with FIG. 1.

At a time t0, signal cmd1 is in the high state and signal cmd2 is in the low state, whereby switches SW1 and SW4 are turned on and switches SW2 and SW3 are turned off. Thus, generator 100 delivers a voltage ramp Vc1, and generator 102 is in the initial state (voltage Vc2 null in this example).

At a next time t1, ramp Vc1 reaches voltage Vref, whereby signal out1 switches to the low state, whereby signals cmd1 and cmd2 respectively switch to the low state and to the high state.

Thus, from time t1, switches SW1 and SW4 are turned off and switches SW2 and SW3 are turned on, whereby generator 102 delivers a voltage ramp Vc2. Further, the turning-on of switch SW2 results in that generator 100 is set to the initial state (voltage Vc1 null in this example), whereby signal out1 switches to the high state little after time t1.

At a next time t2, ramp Vc2 reaches voltage Vref, whereby signal out2 switches to the low state, which results in that signals cmd1 and cmd2 respectively switch to the high state and to the low state.

Thus, from time t2, switches SW1 and SW4 are on and switches SW2 and SW3 are off, whereby generator 100 delivers a voltage ramp Vc1. Further, the turning-on of switch SW4 results in that generator 102 is set to the initial state (voltage Vc2 null in this example), whereby signal out2 switches to the high state little after time t2.

After time t2, the operation of oscillator 1 carries on similarly to what has been described hereabove, whereby signals cmd1 and cmd2 are periodic signals.

Considering that the propagation time Tp in circuit COMP or, in other words, in comparators COMP1 and COMP2, is null, the frequency of signals cmd1 and cmd2 is equal to $Ic/(2*C*Vref)$, C being the value of capacitive elements C1 and C2 and Ic being the value of currents Ic1 and Ic2. In other words, the frequency of signals cmd1 and cmd2 is equal to $Ic/(2*C*R*Vref)$, that is, to half $1/(R*C)$ when current Iref has value Ic. Oscillator 1 is thus currently called an RC oscillator, due to the fact that voltage Vref is available across resistor R and that ramps Vc1 and Vc2 are available across respective capacitive elements C1 and C2 or, in other words, due to the fact that the frequency of signals cmd1 and cmd2 is determined by the values of resistor R and of capacitive elements C1 and C2.

However, in practice, the propagation time Tp of the comparators is not null. As a result, the switching of signal cmd1, respectively cmd2, does not occur at the time t1, respectively t2, when signal Vc1, respectively Vc2, reaches value Vref, but at a time t1+Tp, respectively t2+Tp, when ramp Vc1, respectively Vc2, is at a maximum value Vc1max, respectively Vc2max, greater than voltage Vref. The frequency of signals cmd1 and cmd2 is then equal to $Ic/((2*C)*(Vref+Ic*Tp/C))$, or, in other words, to half $1/(R*C*(Iref/Ic+Tp/(R*C)))$.

Now, the propagation time Tp of the comparators varies with the temperature of oscillator 1, which results in a variation of the frequency of signals cmd1 and cmd2 along with the temperature of oscillator 1. As an example, the frequency of signals cmd1 and cmd2 may vary by +0.3% at −40° C. and by −1.4% at 125° C. with respect to the frequency at 30° C. Such variations are not desirable, in particular when signal cmd1 or cmd2 is used as a clock signal or to generate a clock signal.

An oscillator of the type of that described in relation with FIG. 1 is provided herein, where, according to an embodiment, the value of a set point voltage Vref delivered to circuit COMP, for example, to comparators COMP1 and COMP2, is modulated, or modified or controlled, from the maximum value of at least the last ramp Vc1 and/or from the maximum value of at least the last ramp Vc2. In this case, voltages Vc1 and Vc2 are compared with voltage Vref rather than with voltage Vref.

In the following description, unless indicated otherwise, the expression "maximum value of at least the last ramp Vc1" means either the maximum value Vc1max of the last ramp of voltage Vc1, or the averaged, or smoothed, or filtered maximum value Vc1maxmean of the maximum values Vc1max of a plurality of last voltage ramps Vc1. Similarly, the expression "maximum value of at least the last ramp Vc2" means either the maximum value Vc2max of the last ramp of voltage Vc2, or the averaged, or smoothed, or filtered maximum value Vc2maxmean of the values Vc2max of a plurality of last voltage ramps Vc2. In the following, to avoid overloading the description, one will call maximum value Vc1$m$, respectively Vc2$m$, the maximum value of at least one last voltage ramp Vc1, respectively Vc2. In other words, maximum value Vc1$m$, respectively Vc2$m$, corresponds either to the maximum value Vc1max, respectively Vc2max, of the last voltage ramp Vc1, respectively Vc2, or to the averaged, or smoothed, or filtered maximum value Vc1maxmean, respectively Vc2maxmean, of the maximum values Vc1max, respectively Vc2max, of a plurality of last voltage ramps Vc1, respectively Vc2.

Thus, an increase in value Vc1$m$ and/or in value V2$m$ reflects an increase in propagation time Tp, and, conversely, a decrease in value Vc1$m$ and/or in Vc2$m$ reflects a decrease in propagation time Tp.

According to an embodiment, the value of set point voltage Vref decreases when value Vc1$m$ and/or value Vc2$m$ increases and, conversely, increases when value Vc2$m$ and/or value Vc1$m$ decreases. Preferably, voltage Vref is smaller than voltage Vref.

According to an embodiment, the set point voltage Vref delivered to circuit COMP, for example, to comparators COMP1 and COMP2, is equal to reference voltage Vref minus a difference between reference voltage Vref and maximum value Vc1$m$. In other words, Vref=Vref−(Vc1$m$−Vref).

According to another embodiment, the set point voltage Vref delivered to circuit COMP, for example, to comparators COMP1 and COMP2, is equal to reference voltage Vref minus, alternately, a difference between reference voltage Vref and maximum value Vc1$m$, and a difference between reference voltage Vref and maximum value Vc2$m$. In other words, voltage Vref is alternately equal to Vref−(Vc1$m$−Vref) and to Vref−(Vc2$m$−Vref).

Advantage is here taken from the fact that the maximum value Vc1max of each ramp Vc1 and the maximum value Vc2max of each ramp Vc2 depend on the propagation time Tp of circuit COMP, that is, for example, on the propagation time Tp of the comparators, respectively COMP1 and COMP2. In other words, it is here provided to control the set point voltage Vref delivered to circuit COMP, for example, to comparators COMP1 and COMP2, based on this propagation time Tp.

Figure 3:
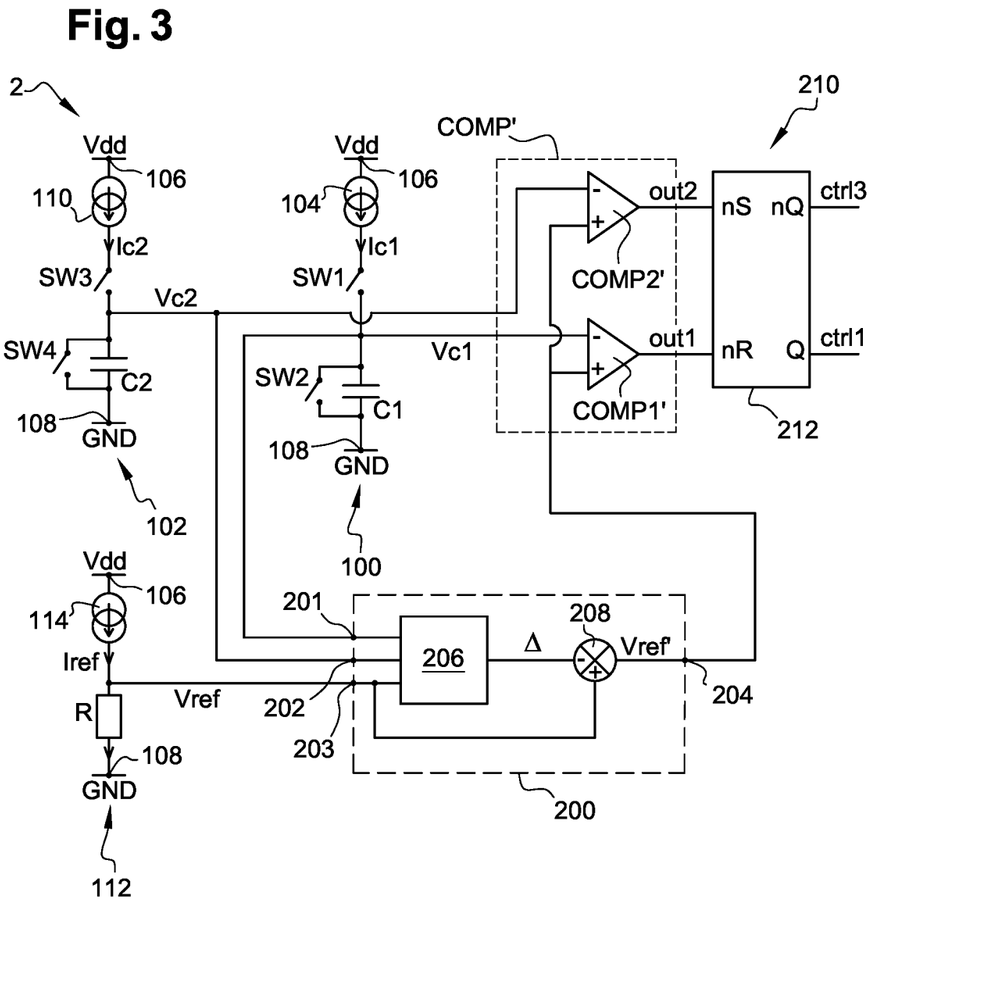
FIG. 3 schematically shows with functional blocks an embodiment of an oscillator.

FIG. 3 schematically shows by means of functional blocks an embodiment of such an oscillator 2. Oscillator 2 comprises elements in common with oscillator 1, which will not be described again.

In particular, oscillator 2 comprises, like oscillator 1, the generator 100 of voltage ramps Vc1, the generator 102 of voltage ramps Vc2, and the generator 112 of voltage Vref, generators 100, 102, and 112 being for example identical to those described in relation with FIG. 1.

However, conversely to oscillator 1 where circuit COMP is configured to compare each voltage ramp Vc1, Vc2 with voltage Vref, in this embodiment, a circuit COMP', for example identical to circuit COMP, is configured to compare each voltage ramp Vc1, Vc2 with set point voltage Vref. Like circuit COMP, circuit COMP' is configured to deliver a binary signal out1 having its high or low state indicating the result of the comparison of voltage Vc1 with voltage Vref, and to deliver a binary signal out2 having its high or low state indicating the result of the comparison of voltage Vc2 with voltage Vref. Circuit COMP' for example comprises three inputs receiving respective voltages Vref, Vc1, and Vc2.

Circuit COMP', for example, comprises a comparator COMP1', for example, identical to comparator COMP1, and a comparator COMP2', for example identical to comparator COMP2. Comparator COMP1' is configured to compare each voltage ramp Vc1 with set point voltage Vref and to deliver signal out1. Comparator COMP2' is configured to compare each voltage ramp Vc2 with set point voltage Vref to deliver signal out2. In this example, the inverting input (−) of comparator COMP1' receives voltage Vc1, the non-inverting input (+) of comparator COMP1' receives voltage Vref, the inverting input (−) of comparator COMP2' receives voltage Vc2, and the non-inverting input (+) of comparator COMP1' receives voltage Vref.

Further, as compared with oscillator 1, oscillator 2 comprises a voltage generator circuit 200 configured to deliver, or generate, voltage Vref.

In the embodiment illustrated in FIG. 3, circuit 200 is configured to modulate voltage Vref based on maximum value Vc1$m$ and on maximum value Vc2$m$. Thus, in this embodiment, circuit 200 comprises an input terminal 201 coupled, for example, connected, to generator 100, for example, to an output terminal of generator on which voltage Vc1 is available, and an input terminal 202 coupled, for example, connected, to generator 102, for example, to an output terminal of generator 102 on which voltage Vc2 is available. Circuit 200 is then configured to determine the maximum values Vc1$m$ and Vc2$m$ based on respective values Vc1 and Vc2.

In an alternative embodiment, not shown, where circuit 200 is configured to modulate voltage Vref only based on maximum value Vc1$m$ or only based on maximum value Vc2$m$, input 202 or 201, respectively, may be omitted.

Circuit 200 further comprises an input terminal 203 coupled, for example connected, to generator 112, for example, to an output terminal of generator 112 on which reference voltage Vref is available.

Circuit 200 further comprises an output terminal 204 on which modulated voltage Vref is available.

In this embodiment, circuit 200 is configured to generate, from voltages Vref, Vc1, and Vc2, a signal Δ representative, alternately, of the difference between voltage Vref and maximum value Vc1$m$ and of the difference between voltage Vref and maximum value Vc2$m$. This functionality of circuit 200 is implemented by a functional block 206. Circuit 200 is further configured to deliver voltage Vref so that it is equal to voltage Vref minus, alternately, the difference between voltage Vref and maximum value Vc1$m$, and the difference between voltage Vref and maximum value Vc2$m$. This functionality of circuit 200 is illustrated by a subtractor block 208 taking as an input signal Δ and voltage Vref and outputting voltage Vref.

In an alternative embodiment, not shown, circuit 200 is configured to modulate voltage Vref only based on maximum value Vc1m or Vc2m. Block or circuit 206 is then configured to deliver signal Δ so that it is representative of the difference between voltage Vref and the maximum value, respectively Vc1m or Vc2m. Further, circuit 200 is then configured to deliver voltage Vref so that it is equal to voltage Vref minus this difference.

Preferably, in this embodiment illustrated in FIG. 3, maximum value Vc1m, respectively Vc2m, corresponds to value Vc1maxmean, respectively Vc2maxmean. In this case, block or circuit 206 is preferably configured to update and store a first signal Vc1-sig (not shown in FIG. 3) representative of value Vc1maxmean and to update and store a second signal Vc2-sig (not shown in FIG. 3) representative of maximum value Vc2maxmean. Signal A is then determined based on these signals Vc1-sig and Vc2-sig. Preferably, signal Δ is alternately determined based on signal Vc1-sig and based on signal Vc2-sig.

Oscillator 2 further comprises a control circuit 210, partially shown in FIG. 3. Based on signals out1 and out2, control circuit 210 is configured to: stop a voltage ramp Vc1 and start a voltage ramp Vc2 when voltage ramp Vc1 reaches voltage Vref, and stop a voltage ramp Vc2 and start a voltage ramp Vc1 when voltage ramp Vc2 reaches voltage Vref.

According to an embodiment, a voltage ramp Vc1 is stopped by the switching of switch SW1 to the off state, and a voltage ramp Vc2 is stopped by the switching of switch SW3 to the off stat. Conversely, a voltage ramp Vc1 starts when switch SW1 switches to the on state, and a voltage ramp Vc2 starts when switch SW3 switches to the on state. As an example, control circuit 210 comprises an RS latch 212 having an input nS receiving signal out2, an input nR receiving signal out1, an output nQ delivering a signal ctrl3 for controlling switch SW3, and an output Q delivering a signal ctrl1 for controlling switch SW1. In this example, the RS latch is configured to: set signal ctrl3 to the high state and signal ctrl1 to the low state when signal out1 switches to the low state while signal out2 is in the high state, and set signal ctrl1 to the high state and signal ctrl3 to the low state when signal out2 switches to the low state when signal out1 is in the high state. In this example, switches SW1 and SW3 are off when their respective control signals are in the high state, and on when their respective control signals are in the high state.

According to an embodiment, control circuit 210 is further configured, based on signals out1 and out2, to reset generator 100 between every two successive voltage ramps Vc1, and to reset generator 102 between every two successive voltage ramps Vc2. The resetting of generator 100, respectively 102, comprises setting back voltage Vc1, respectively Vc2, to an initial value, that is, the value of voltage Vc1, respectively Vc2, at the beginning of a ramp.

According to an embodiment, the resetting of generator 100, respectively 102, is implemented by turning on and then turning off switch SW2, respectively SW4.

According to an embodiment, control circuit 210 is configured so that the resetting of generator 100, respectively 102, occurs at the end of a timing period Ttemp starting at the stopping, or end, of a ramp Vc1, respectively Vc2, timing period Ttemp being sufficiently short for generator 100, respectively 102, to be reset before the end of the next ramp Vc1, respectively Vc2. Thus, for each voltage ramp Vc1, respectively Vc2, voltage Vc1, respectively Vc2, remains at its maximum value Vc1max, respectively Vc2max all along timing period Ttemp. This enables circuit 200 to be able to read this maximum value during timing period Ttemp, and thus to update signal Vc1-sig or Vc2-sig during time period Ttemp.

The implementation of control circuit 210 so that it generates, from signals out1 and out2, or even from signals ctrl3 and ctrl1, for example, the control signals for resetting generators 100 and 102 is within the abilities of those skilled in the art based on the functional indications given hereabove.

Preferably, when block 206 is configured to update and store signal Vc1-sig and/or to update and store signal Vc2-sig, control circuit 210 is further configured to deliver the signals for controlling these update and storage phases. In this case, although this is not shown in FIG. 3, circuit 200 comprises input terminals configured to receive these control signals originating from circuit 210.

The implementation of control circuit 210 so that it generates, from signals out1 and out2, or even from signals ctrl3 and ctrl1, for example, the control signals of circuit 200 is within the abilities of those skilled in the art based on the functional indications given hereabove.

According to an embodiment, oscillator 2 is used to generate a clock signal. This clock signal may then correspond to signal out1, to signal out2, to signal ctrl3, or to signal ctrl1. However, due to the pulsed nature of signals out1 and out2, the clock signal is preferably obtained after the shaping of signal out1 and/or out2, this shaped signal for example being signal ctrl1 or ctrl3.

Figure 4:
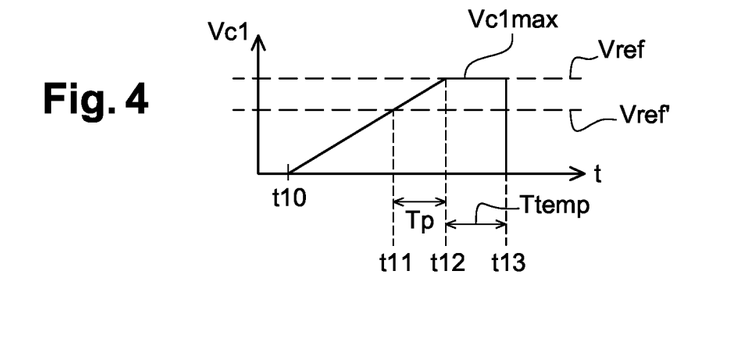
FIG. 4 shows a timing diagram illustrating the operation of the oscillator of FIG. 3.

FIG. 4 shows a timing diagram of a voltage ramp Vc1 illustrating the operation of oscillator 2 of FIG. 3.

Before a time t10, generator 100 has been reset and voltage Vc1 is at an initial value, that is, 0 V in this example where ramps Vc1 are increasing.

At time t10, a voltage ramp Vc1 starts.

At a next time t11, voltage Vc1 reaches (crosses) voltage Vref. However, the output out1 (not shown in FIG. 4) of comparator COMP1' (FIG. 3) only switches at a next time t12 equal to t11+Tp. In other words, the output out1 of comparator COMP1' switches with a delay Tp relative to time t11, delay Tp corresponding to the propagation time in comparator COMP1'.

Due to the fact that between times t11 and t12, because of the propagation time Tp in comparator COMP1', the output out1 of comparator COMP1' remains in a state indicating that voltage ramp Vc1 has not reached voltage Vref yet, control circuit 210 does not control the stopping of voltage ramp Vc1 by generator 100. Thus, in this example where ramps Vc1 are increasing, ramp Vc1 keeps on increasing until time t12.

At time t12, the output out1 of comparator COMP1' switches, whereby circuit 210 controls the stopping of voltage ramp Vc1. Voltage ramp Vc1 thus reaches its maximum value Vc1max at time t12, and this maximum value Vc1max is then equal to voltage Vref. In other words, output out1 switches at the time when voltage Vc1 reaches set point voltage Vref, as if comparator COMP 1' had compared voltage Vc1 with voltage Vref and had a null propagation time Tp.

As a result, the frequency of the signals out1 and out2 of oscillator 2 is equal to the frequency of the signals out1 and out2 of oscillator 1 in the ideal case where the propagation time Tp in circuit COMP, for example, in comparators COMP1 and COMP2, of oscillator 1, is null.

In the example of FIG. 4, after time t12, voltage Vc1 remains at its maximum value Vc1max until a time t13 equal to t12+Ttemp. Thus, between times t12 and t13, the maximum value Vc1max of voltage ramp Vc1 is available for circuit 200. At time t13, generator 100 is reset, for example, under control of circuit 210, and voltage Vc1 is set back to its initial value, whereby signal out1 switches.

Although this is not shown in FIG. 4, time t10 corresponds to the end of a voltage ramp Vc2 and time t12 corresponds to the beginning of a new voltage ramp Vc2.

Although it is not illustrated, the operation of oscillator 2 during a voltage ramp Vc2 can be deduced from the operation of oscillator 2 during a voltage ramp Vc1, as described in relation with FIG. 4. It should however be noted that, in an alternative embodiment, not shown, where circuit 200 is configured to modulate voltage Vref only based on maximum value Vc1m, respectively Vc2m, timing period Ttemp for the resetting of generator 102, respectively 100, may be null.

Figure 5:
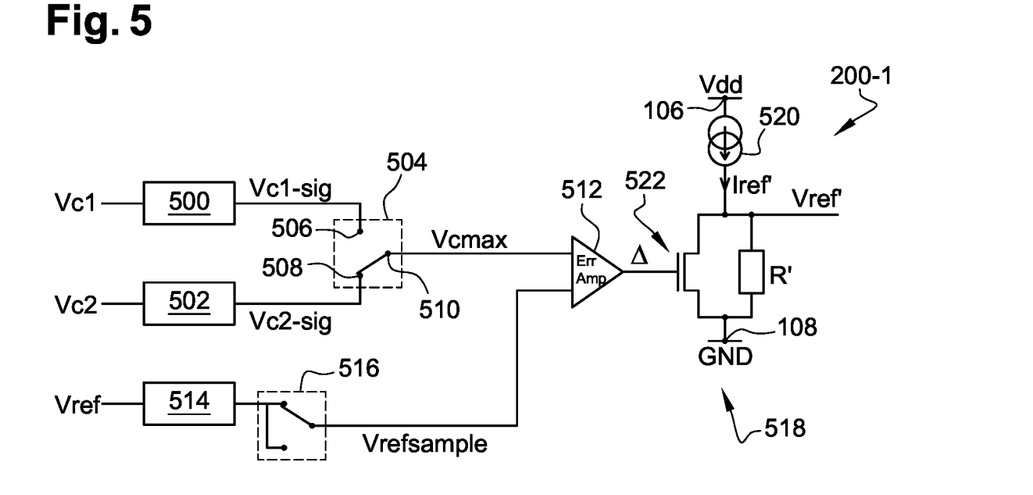
FIG. 5 shows in further detail an embodiment of a portion of the oscillator of FIG. 3.

FIG. 5 shows in more detailed fashion an embodiment of a portion of the oscillator 2 of FIG. 3, and more particularly, an embodiment of the circuit 200 of FIG. 3, this circuit here bearing reference 200-1. It should be noted that what has been indicated for the circuit 200 of FIG. 3 applies to the circuit 200-1 of FIG. 5.

In this embodiment, circuit 200-1 is configured to modulate voltage Vref based on maximum value Vc1m and on maximum value Vc2m. In other words, signal Δ is determined, preferably alternately, from signal Vc1-sig and from signal Vc2-sig.

More particularly, in this embodiment, circuit 200 is configured to update and store the first signal Vc1-sig representative of maximum value Vc1m, and to update and store the second signal Vc2-sig representative of maximum value Vc2m.

In this embodiment, circuit 200-1 comprises a circuit 500 configured to generate signal Vc1-sig, in practice a voltage, based on voltage Vc1. Circuit 500 thus comprises an input configured to receive voltage Vc1 and an output configured to deliver signal Vc1-sig. More particularly, at the end of each voltage ramp Vc1, during timing period Ttemp, circuit 500 is configured to update signal Vc1-sig based on the maximum value Vc1max of this voltage ramp Vc1, and then to store the updated signal Vc1-sig.

Similarly, circuit 200-1 comprises a circuit 502 configured to generate signal Vc2-sig, in practice a voltage, based on voltage Vc2. Circuit 502 thus comprises an input configured to receive voltage Vc2 and an output configured to deliver signal Vc2-sig. More particularly, at the end of each voltage ramp Vc2, during timing period Ttemp, circuit 502 is configured to update signal Vc2-sig based on the maximum value Vc2max of this voltage ramp Vc2, and then to store the updated signal Vc2-sig.

Preferably, the phases of update and storage of signals Vc1-sig and Vc2-sig are controlled by control signals originating from control circuit 210 (FIG. 3), circuits 500 and 502 then comprising input terminals configured to receive these control signals, which input terminals are not shown in FIG. 5.

Circuit 200-1 further comprises a commutator 504 comprising an input 506 configured to receive signal Vc1-sig, an input 508 configured to receive signal Vc2-sig, and an output 510 configured to deliver a signal, for example, a voltage, Vcmax equal to signal Vc1-sig when a signal (not shown) for controlling commutator 504 is in a first binary state, and to signal Vc2-sig when the signal for controlling commutator 504 is in a second binary state. Thus, signal Vcmax is alternately equal to signal Vc1-sig and to signal Vc2-sig. Preferably, the signal for controlling commutator 504 is delivered by control circuit 210 (FIG. 3).

Circuit 200 further comprises an error amplifier 512 ("Err Amp") configured to deliver signal Δ. Error amplifier 512 comprises an input configured to receive signal Vcmax, this input of error amplifier 512 being coupled, for example, connected, to the output 510 of commutator 504. Amplifier 512 further comprises another input configured to receive a signal Vrefsample representative of voltage Vref, that is, determined by voltage Vref.

In the embodiment of FIG. 5, circuit 200 comprises an optional circuit 514 configured to generate signal Vrefsample based on voltage Vref. Circuit 514 thus comprises an input configured to receive voltage Vref and an output configured to deliver signal Vrefsample. Preferably, at the end of each voltage ramp Vc1 or at the end of each ramp Vc2, during timing period Ttemp, circuit 514 is configured to update signal Vrefsample based on voltage Vref, and then to store the updated signal Vrefsample. The operation of circuit 514 and the implementation of circuit 514 are, for example, similar to those of circuits 500 and 502.

In the embodiment of FIG. 5, the output of circuit 514 is coupled to the input of error amplifier 512 configured to receive signal Vrefsample via an optional commutator 516, preferably identical to commutator 504. Commutator 516 comprises two inputs, both coupled, preferably connected, to the output of circuit 514, and an output coupled to said input of error amplifier 512. Preferably, commutator 516 is controlled identically to commutator 504, for example, by the same control signal. As will be seen in further detail hereafter, the provision of commutator 516 enables for the same charge injections to occur on signal Vcmax and on signal Vrefsample, so that these charge injections cancel out at the level of error amplifier 512.

According to an embodiment, each circuit 500, 502, and 514 stores the signal, respectively, Vc1-sig, Vc2-sig, and Vrefsample across a capacitive element coupled to the input of this circuit by a switch, as will be described in further detail in relation with FIGS. 6 and 7. During their switching, these switches may inject charges onto the capacitive elements to which they are coupled. The provision of circuit 514 enables for the same charge injections to occur on the output signal of circuit 514, and on signals Vc1-sig and Vc2-sig. Thus, the charge injections into circuits 500, 502, and 514 cancel in signal Δ, due to the fact that this signal Δ is a differential signal representative of the difference between signals Vcmax and Vrefsample. Similarly, the switching of commutator 504 may inject charges onto signal Vcmax. The provision of commutator 516 enables for the same charge injections to occur on signal Vcmax and on signal Vrefsample, and to cancel out in signal Δ.

In an alternative embodiment, not illustrated, commutator 516 and circuit 514 are omitted, signal Vrefsample then being identical to signal Vref or, in other words, confounded with signal Vref. In another alterative embodiment, not illustrated, only commutator 516 is omitted, the output of circuit 514 then delivering signal Vrefsample and being, for example, connected to the corresponding input of error amplifier 512.

Circuits 500 and 502, optional circuit 514, commutator 504, optional commutator 516, and error amplifier 512 implement the functions of the block or circuit 206 described in relation with FIG. 3.

In the embodiment of FIG. 5, circuit 200 comprises a voltage generator 518 configured to deliver voltage Vref, generator 518 being controlled by signal Δ. Generator 518 implements the function of the subtractor block 208 described in relation with FIG. 3.

As an example, generator 518 comprises, like the generator 112 described in relation with FIG. 3, a current source 520 configured to deliver a constant current Iref, preferably equal to current Iref (FIG. 3), and a resistor R', preferably identical to resistor R (FIG. 3). Current source 520 and resistor R' are series-connected between nodes 106 and 108. Generator 518 further comprises a MOS ("Metal Oxide Semiconductor") transistor 522 connected in parallel with resistor R', the gate of transistor 522 receiving signal Δ. Thus, when the difference between voltage Vref and maximum values Vc1m and Vc2m increases, signal Δ increases, which enables to decrease the equivalent resistance corresponding to the parallel association of resistor R' and of transistor 522, which results in a decrease in voltage Vref.

An example of embodiment of circuit 200-1 in the case where circuit 200-1 is configured to modulate voltage Vref based on maximum value Vc1m and based on maximum value Vc2m has been described hereabove in relation with FIG. 5.

In an alternative embodiment, not shown, circuit 200-1 is configured to modulate voltage Vref only based on maximum value Vc1m. In this variant, commutator 504, circuit 502, and optional commutator 516 are omitted. Signal Vcmax is then identical to signal Vc1-sig, that is, confounded with signal Vc1-sig. In another alternative embodiment, not shown, circuit 200 is configured to modulate voltage Vref only based on maximum value Vc2m. In this other variant, commutator 504, circuit 500, and optional commutator 516 are omitted. Signal Vcmax is then identical to signal Vc2-sig, that is, confounded with signal Vc2-sig.

Figure 6:
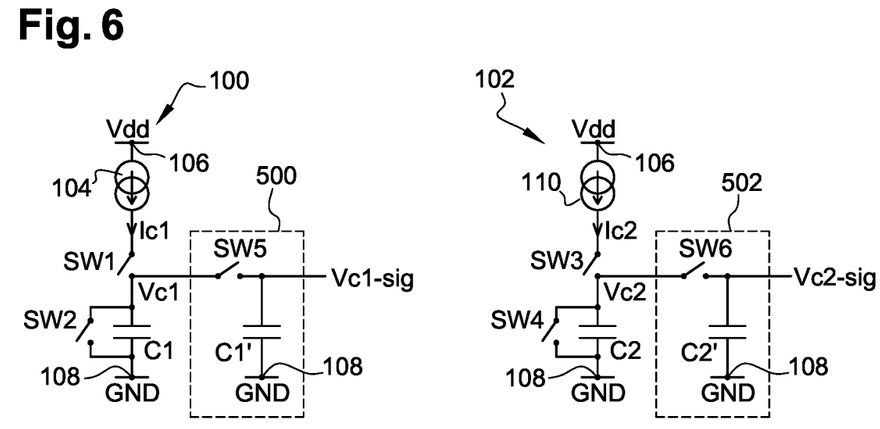
FIG. 6 shows in further detail an embodiment of a portion of the oscillator of FIG. 3.

FIG. 6 shows in more detailed fashion an embodiment of a portion of the oscillator 2 of FIG. 3. More exactly, FIG. 6 shows in more detailed fashion an embodiment of the circuits 500 and 502 described in relation with FIG. 5, circuit 500, respectively 502, being here connected to the generator 100, respectively 102, of oscillator 2.

Circuit 500 comprises a series association of a capacitive elements C1' and of a switch SW5, connected in parallel with capacitive element C1, switch SW5 being connected to a terminal of capacitive element C1 on which voltage Vc1 is available. In other words, switch SW5 couples the output of generator 100 to a first terminal of capacitive element C1', the second terminal of capacitive element C1' being coupled, preferably connected, to node 108. Capacitive element C1' is preferably identical to capacitive element C1. Signal Vc1-sig corresponds to the voltage across capacitive element C1', or, in other words, voltage Vc1-sig is available on the first terminal of capacitive element C1' which then forms the output of circuit 500. Voltage Vc1-sig is updated based on voltage Vc1 by the turning-on of switch SW5, and is stored across capacitive element C1' by the turning-off of switch SW5. Preferably, the signal for controlling switch SW5 is delivered by control circuit 210 (FIG. 3). Preferably, after each voltage ramp Vc1, switch SW5 is switched to the on state during the timing period Ttemp following the stopping of the ramp, and is then switched to the off state at the end of this period Ttemp.

Similarly, circuit 502 comprises a series association of a capacitive element C2' and of a switch SW6, connected in parallel with capacitive element C2, switch SW6 being connected to a terminal of capacitive element C2 on which voltage Vc2 is available. In other words, switch SW6 couples the output of generator 102 to a first terminal of capacitive element C2', the second terminal of capacitive element C2' being coupled, preferably connected, to node 108. Capacitive element C2' is preferably identical to capacitive element C2. Signal Vc2-sig corresponds to the voltage across capacitive element C2', or, in other words, the voltage Vc2-sig is available on the first terminal of capacitive element C2' which then forms the output of circuit 502. Voltage Vc2-sig is updated based on voltage Vc2 by the turning-on of switch SW6, and is stored across capacitive element C2' by the turning-off of switch SW6. Preferably, the signal for controlling switch SW6 is delivered by control circuit 210 (FIG. 3). Preferably, after each voltage ramp Vc2, switch SW6 is switched to the on state during the timing period Ttemp following the stopping of the ramp, and is then switched to the off state at the end of this period Ttemp.

The implementation of circuit 210 (FIG. 3) to deliver the signals for controlling switches SW5 and SW6, based on signals out1 and out2 (FIG. 3), is within the abilities of those skilled in the art based on the functional indications given hereabove.

In an alternative embodiment, not shown, generator 100 comprises an additional switch connected in parallel with the series association of switch SW1 and of capacitive element C1, this additional switch being controlled, for example, like switch SW2. This additional switch enables to couple current source 104 to node 108 when switch SW1 is turned off to decrease, or even suppress, possible transient phenomena on the terminal of current source 104 coupled to switch SW1. Symmetrically, in this variant, generator 102 comprises an additional switch connected in parallel with the series association of switch SW3 and of capacitive element C2, this additional switch being controlled, for example, like switch SW4.

Figure 7:
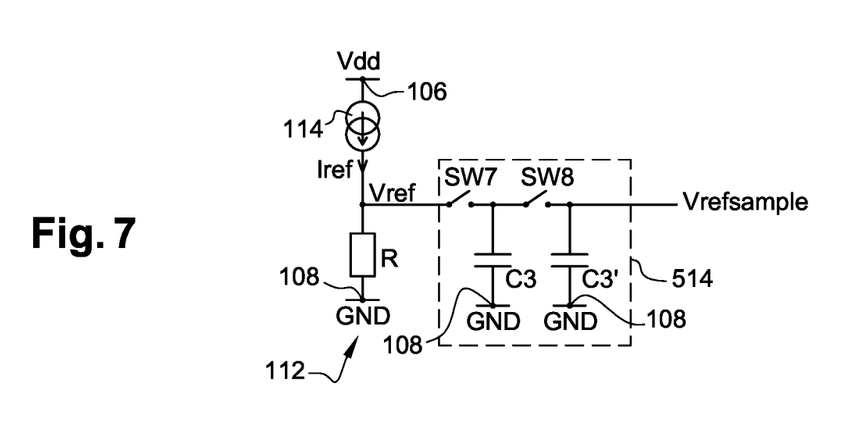
FIG. 7 shows in further detail an embodiment of a portion of the oscillator of FIG. 3.

FIG. 7 shows in more detailed fashion an embodiment of a portion of the oscillator 2 of FIG. 3. More exactly, FIG. 7 shows in more detailed fashion an embodiment of the circuit 514 described in relation with FIG. 5, circuit 514 being here connected to the generator 112 of oscillator 2.

Circuit 514 comprises a capacitive element C3 and a switch SW7 coupling the output of generator 112, that is, a node for delivering voltage Vref to a first terminal of capacitive element C3, the second terminal of capacitive element C3 being coupled, preferably connected, to node 108. Circuit 514 comprises a capacitive element C3', preferably identical to capacitive element C3, and a switch SW8 coupling the first terminal of capacitive element C3, that is, the node of connection between capacitive element C3 and switch SW7, to a first terminal of capacitive element C3', the second terminal of capacitive element C3' being coupled, preferably connected, to node 108. Voltage Vrefsample is available on the first terminal of capacitive element C3', which forms the output of circuit 514.

Preferably, the signals for controlling switches SW7 and SW8 are delivered by control circuit 210 (FIG. 3), based on signals out1 and out2. As an example, switch SW7 is controlled like switch SW1 (FIG. 6), and switch SW8 is then controlled like switch SW5 (FIG. 6). Thus, the charge injections on capacitive elements C3' due to the switching of switches SW7 and SW8 are identical to the charge injections on capacitive element C1' (FIG. 6) due to the switching of switches SW1 and SW5. According to another example, switches SW7 and SW8 are controlled in the same way as the respective switches SW3 and SW6 (FIG. 6), the charge injections on capacitive element C3' due to the switching of switches SW7 and SW8 then being identical to the charge injections on capacitive element C2' (FIG. 6) due to the switching of switches SW3 and SW6.

Figure 8:
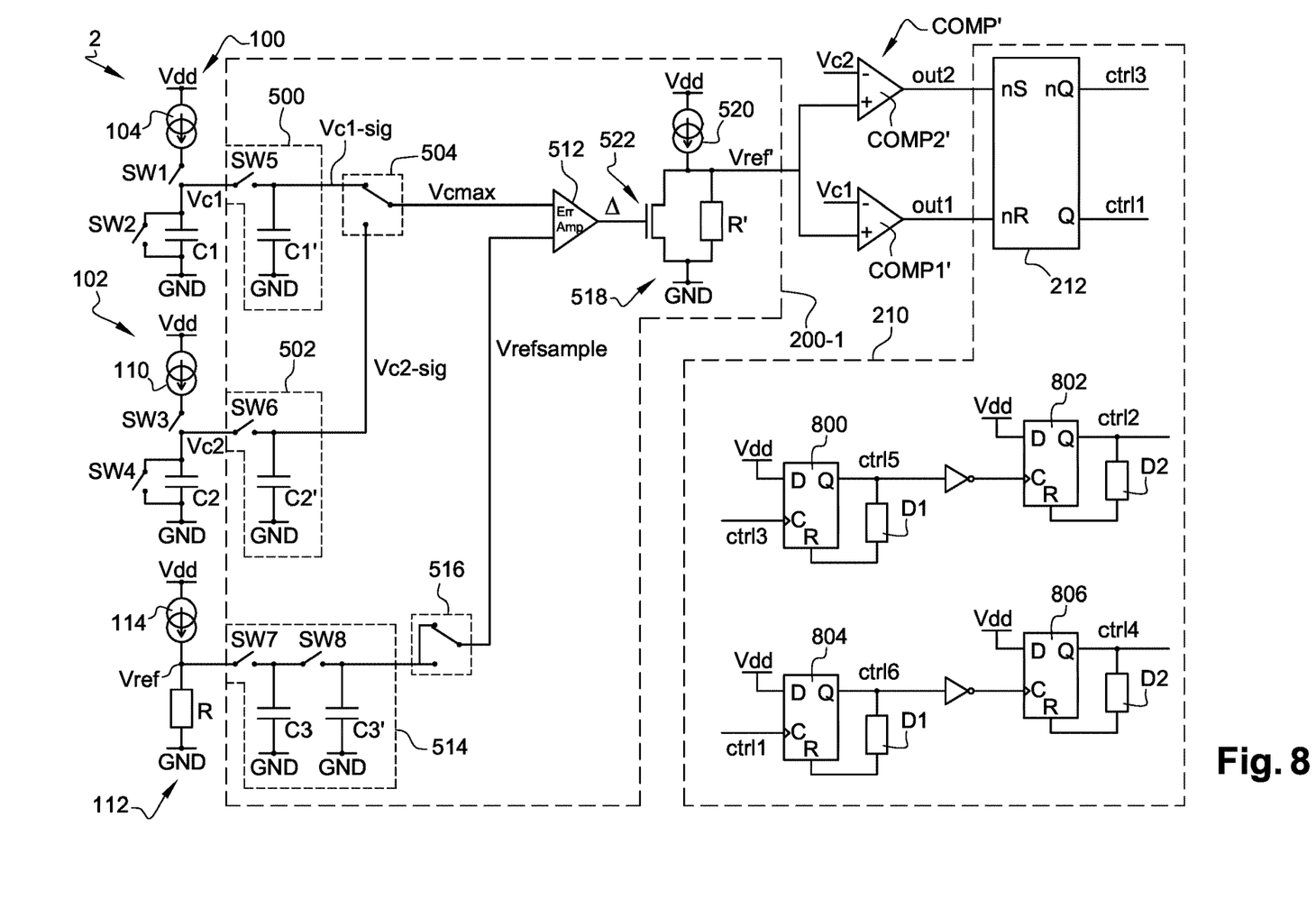
FIG. 8 shows in further detail an embodiment of the oscillator of FIG. 3.

FIG. 8 shows in more detailed fashion an embodiment of the oscillator 2 of FIG. 3. More exactly, in FIG. 8, the circuit 200 of oscillator 2 is implemented by the circuit 200-1 of FIG. 5, circuits 500 and 502 being implemented as illustrated in FIG. 6 and circuit 514 being implemented as illustrated in FIG. 7. Further, in FIG. 8, an embodiment of circuit 210 is detailed.

In this detailed embodiment, it is considered that switches SW1, SW2, SW3, SW4, SW5, SW6, SW7, and SW8 are on, respectively off, when their respective control signals are in the high, respectively low, state.

Control circuit 210 comprises latch 212 such as described in relation with FIG. 3. In this example, as in FIG. 3, signal ctrl1 is the signal for controlling switch SW1 and signal ctrl3 is the signal for controlling switch SW3.

In this example, control circuit 210 further comprises a D flip-flop 800. Flip-flop 800 comprises a D data input receiving potential Vdd, a C synchronization input active on a rising edge and receiving signal ctrl3, a Q output having potential Vdd copied and stored thereon at each rising edge of signal ctrl3, and an R input. The Q output of flip-flop 800 is set back to potential GND when the signal applied to the R input of the flip-flop is in the high state. The Q output of flip-flop 800 is coupled to the R input of flip-flop 800 by a circuit D1 introducing a delay equal to time period Ttemp. A signal ctrl5 for controlling switch SW5 is available on the Q output of flip-flop 800, this signal being delivered to the R input of the flip-flop with delay Ttemp by circuit D1.

In this example, circuit 210 further comprises a D flip-flop 802, identical to flip-flop 800. The C input of flip-flop 802 is coupled to the Q output of flip-flop 800 by an inverter. In other, the C input of flip-flop 802 receives the inverse of signal ctrl5. The D input of flip-flop 802 receives potential Vdd. A signal ctrl2 for controlling switch SW2 is available on the Q output of flip-flop 802, this signal being delivered to the R input of flip-flop 802 with a delay introduced by a circuit D2 coupling the Q output and the R input of flip-flop 802.

Thus, when a voltage ramp Vc1 crosses voltage Vref by causing the switching to the low state of signal out1, signal ctrl3 switches to the high state, which results in the turning-on of switch SW3 and in the beginning of a ramp Vc2, and signal ctrl1 switches to the low state, which results in the turning-off of switch SW1 and in the end of ramp Vc1. The rising edge on signal ctrl3 further causes the switching of signal ctrl5 to the high state and the turning-on of switch SW5 (update of voltage Vc1max). Signal ctrl5 remains in the high state all along time period Ttemp, until the rising edge of signal ctrl5 is transmitted to the R input of flip-flop 800 by circuit D1, which causes the switching of signal ctrl5 to the low state and the turning-off of switch SW5 (storage of voltage Vc1max). The switching of signal ctrl5 to the low state causes the application of a rising edge to the C input of flip-flop 802, which results in the switching of signal ctrl2 to the high state and in the turning-on of switch SW2 (resetting of voltage Vc1). Signal ctrl2 remains in the high state until the rising edge of signal ctrl2 is transmitted to the R input of flip-flop 802 by circuit D2, which causes the switching of signal ctrl2 to the low state and in the turning-off of switch SW2.

In this example, control circuit 210 further comprises a D flip-flop 804, identical to flip-flops 800 and 804. Flip-flop 804 comprises a D data input receiving potential Vdd, a C synchronization input receiving signal ctrl1, and a Q output delivering a signal ctrl6 for controlling switch SW6. The Q output of flip-flop 804 is coupled to an R input of flip-flop 804 by a circuit D1 introducing a delay equal to time period Ttemp.

In this example, circuit 210 further comprises a D flip-flop 806, identical to flip-flop 800. The C input of flip-flop 806 is coupled to the Q output of flip-flop 804 by an inverter. In other words, the C input of flip-flop 806 receives the inverse of signal ctrl6. The D input of flip-flop 806 receives potential Vdd. A signal ctrl4 for controlling switch SW4 is available on the Q output of flip-flop 806, this signal being delivered to the R input of flip-flop 806 with a delay introduced by a circuit D2 coupling the Q output and the R input of flip-flop 806.

Thus, when a voltage ramp Vc2 crosses voltage Vref by causing the switching to the low state of signal out2, signal ctrl1 switches to the high state, which results in the turning-on of switch SW1 and in the beginning of a ramp Vc1, and signal ctrl3 switches to the low state, which results in the turning-off of switch SW3 and in the end of ramp Vc2. The rising edge on signal ctrl1 further causes the switching of signal ctrl6 to the high state and the turning-on of switch SW6 (update of voltage Vc2max). Signal ctrl6 remains in the high state all along time period Ttemp, until the rising edge of signal ctrl6 is transmitted to the R input of flip-flop 804 by circuit D1, which causes the switching of signal ctrl6 to the low state and the turning-off of switch SW6 (storage of voltage Vc2max). The switching of signal ctrl6 to the low state causes the application of a rising edge to the C input of flip-flop 806, which results in the switching of signal ctrl4 to the high state and in the turning-on of switch SW4 (resetting of voltage Vc2). Signal ctrl4 remains in the high state until the rising edge of signal ctrl4 is transmitted to the R input of flip-flop 806 by circuit D2, which causes the switching of signal ctrl4 to the low state and the turning-off of switch SW4.

It will be within the abilities of those skilled in the art to select a switching frequency of commutator 504 and of the possible commutator 516, and to implement the generation of the control signals of these commutators by circuit 210. As an example, the signal for controlling each of commutators 504 and 516 is switched at each beginning of a ramp Vc1 and Vc2, for example, so that during each voltage ramp Vc1, signal Vcmax is equal to signal Vc2max and that during each voltage ramp Vc2, signal Vcmax is equal to signal Vc1max. As another example, commutator 504 and the possible commutator 516 are switched on integral divisions of a clock signal obtained from oscillator 2, which enables signal Vcmax to be representative of an average between signals Vc1-sig and Vc2-sig, signal Vcmax alternately taking the value of signal Vc1-sig and the value of signal Vc2-sig at the switching frequency of commutators 504 and 516.

In the example of FIG. 8, switches SW7 and SW8 are for example controlled identically to the respective switches SW1 and SW3. In other examples, not illustrated, the switches may be controlled identically to respective switches SW1 and SW5, when commutator 504 is in a first state where signal Vcmax is equal to signal Vc1-sig, and identically to respective switches SW3 and SW6 when the commutator is in a second state where signal Vcmax is equal to signal Vc2-sig.

It will be within the abilities of those skilled in the art to select the value of period Ttemp and that of the delay introduced by each of circuits D2 so that the succession of a phase of update of voltage Vc1max, respectively Vc2max, of storage of voltage Vc1max, respectively Vc2max, and of resetting of voltage Vc1, respectively Vc2, are all implemented while generator 102, respectively 100, delivers a voltage ramp Vc2, respectively Vc1.

Although this has not been previously described in relation with FIGS. 1 to 8, comparators COMP1' and COMP2' may each exhibit an offset between their inverting and non-inverting inputs. However, usually, this offset may be decreased, or even suppressed, during a phase of calibration of comparators COMP1' and COMP2'. Further, although this offset may vary with the temperature of oscillator 2, the influence of the variation of this offset with temperature on the frequency of the signals delivered by the oscillator is negligible as compared with that of the variation of the propagation time of comparators COMP1' and COMP2' along with the oscillator temperature. It can also be considered that this input offset has an influence on propagation time Tp, and that it is thus compensated for by the variation of voltage Vref with propagation time Tp.

Further, first embodiments and variants where circuit 200 is configured to modulate voltage Vref based on maximum value Vc1m and on maximum value Vc2m and second embodiments and variants where circuit 200 is configured to modulate voltage Vref only based on maximum value Vc1m or only based on maximum value Vc2m have been described. These first and second embodiments and variants enable to obtain periodic signals, for example, signals ctrl3 and ctrl1 having a frequency which varies little, for example, by less than 1%, over the temperature range from −40° C. to 130° C. However, the first embodiments and variants have the additional advantage that these periodic signals also have a duty cycle which varies little, for example, by less than 1% over the temperature range from −40° C. to 130° C., as compared with that of these same periodic signals in the second embodiments and variants. The first embodiments and variants further enable, as compared with the second embodiments and variants, to correct possible offsets between the value of capacitive element C1 and that of capacitive element C2, and/or between the value of current Id 1 and that of current Ic2, and/or between the value of the propagation time of comparator COMP l' and that of the propagation time of comparator COMP2'.

Various embodiments and variants have been described. Those skilled in the art will understand that certain features of these various embodiments and variants may be combined, and other variants will occur to those skilled in the art. In particular, it will be within the abilities of those skilled in the art to adapt the described embodiments and variants: to the case where ramps Vc1 and Vc2 are decreasing, and/or to the case where one or a plurality of switch control signals cause the turning-on of these respective switches when these signals are in the high state rather than in the low state, and/or to the case where voltage Vref is delivered to the inverting input of comparator COMP1 and/or of comparator COMP2.

More generally, it will be within the abilities of those skilled in the art to provide other implementations of circuits 200, 210, 500, 502, 514, 100, 102, 112, and/or 518 than those described hereabove as an example.

Finally, the practical implementation of the described embodiments and variations is within the abilities of those skilled in the art based on the functional indications given hereabove. In particular, it will be within the abilities of those skilled in the art to implement circuits 200, 210, 500, 502, 514, 100, 102, 112, and/or 518 based on the functional indications given hereabove.

The invention claimed is:

1. A device, comprising:
a first generator configured to generate a first series of first voltage ramps;
a second generator configured to generate a second series of second voltage ramps;
a first circuit configured to compare each first voltage ramp with a set point voltage and deliver a first signal representative of the comparison of said first voltage ramp with the set point voltage, and to compare each second voltage ramp with the set point voltage and deliver a second signal representative of the comparison of said second voltage ramp with the set point voltage;
a second circuit configured, based on the first and second signals, to:
stop the first voltage ramp and start the second voltage ramp when said first voltage ramp reaches the set point voltage; and
stop the second voltage ramp and start the first voltage ramp when said second voltage ramp reaches the set point voltage; and
a third circuit configured to modulate the set point voltage based on a maximum value of at least a last first voltage ramp in the first series compared with the set point voltage;
wherein the second circuit is further configured to reset the first generator between every two successive first voltage ramps in the first series, and to reset the second generator between every two successive second voltage ramps in the second series.

2. The device according to claim 1, wherein:
the first generator comprises a first capacitive element, a first switch, and a first current source series-connected between a node of application of a power supply voltage and a node of application of a reference potential, and a second switch connected in parallel with the first capacitive element; and
the second generator comprises a second capacitive element, a third switch, and a second current source series-connected between the node of application of the power supply voltage and the node of application of the reference potential, and a fourth switch connected in parallel with the second capacitive element;
wherein the second circuit is configured based on the first and second signals to:
turn on the first switch and turn off the third switch when the second voltage ramp reaches the set point voltage; and
turn on the third switch and turn off the first switch when the first voltage ramp reaches the set point voltage.

3. The device according to claim 2, wherein the first generator is reset by the turning-on of the second switch, wherein the second generator is reset by the turning-on of the fourth switch, and wherein the second circuit is configured to control the second and fourth switches based on the first and second signals.

4. A device, comprising:
a first generator configured to generate a first series of first voltage ramps;
a second generator configured to generate a second series of second voltage ramps;
a first circuit configured to compare each first voltage ramp with a set point voltage and deliver a first signal representative of the comparison of said first voltage ramp with the set point voltage, and to compare each second voltage ramp with the set point voltage and deliver a second signal representative of the comparison of said second voltage ramp with the set point voltage;

a second circuit configured, based on the first and second signals, to:
    stop the first voltage ramp and start the second voltage ramp when said first voltage ramp reaches the set point voltage; and
    stop the second voltage ramp and start the first voltage ramp when said second voltage ramp reaches the set point voltage; and
a third circuit configured to modulate the set point voltage based on a maximum value of at least a last first voltage ramp in the first series compared with the set point voltage;
wherein the third circuit is configured to generate a third signal representative of a difference between a reference voltage and a maximum value of at least said last first voltage ramp in the first series, and to deliver the set point voltage equal to the reference voltage minus said difference.

5. The device according to claim 4, wherein the third circuit comprises a third current source and a resistor series-connected between a node of application of a power supply voltage and a node of application of a reference potential, and a transistor connected in parallel with the resistor, a terminal for controlling the transistor configured to receive the third signal.

6. The device according to claim 4, wherein the third circuit comprises a fourth circuit configured to update and then store a first voltage representative of the maximum value of each first voltage ramp, between an end of each first voltage ramp and a next resetting of the first generator, the second circuit being configured to control the storage and then the update based on the first and second signals.

7. The device according to claim 6, wherein:
    the fourth circuit comprises a series association of a capacitive element and a switch, said series association being connected in parallel with a first capacitive element of the first generator and the first voltage being available across said capacitive element;
    the first voltage being updated in response to turning-on of said switch and stored in response to turning-off of said switch; and
    the second circuit is configured to control switching of the fourth circuit based on the first and second signals.

8. The device according to claim 6, wherein the third circuit comprises an error amplifier having a first input configured to receive a signal representative of the reference voltage, a second input configured to receive the first voltage, and an output terminal configured to deliver the third signal.

9. The device according to claim 8, wherein the third circuit comprises a circuit for storing the reference voltage comprising:
    a capacitive element and a first switch coupling a node for delivering the reference voltage to a terminal of said capacitive element, the other terminal of said capacitive element being coupled to a node of application of a reference potential;
    another capacitive element and a second switch coupling a node of connection between said capacitive element and said first switch to a terminal of said other capacitive element, another terminal of said other capacitive element being coupled to the node of application of the reference potential; and
    wherein the third circuit is configured to control the first and second switches of the circuit for storing based on the first and second signals.

10. A device, comprising:
a first generator configured to generate a first series of first voltage ramps;
a second generator configured to generate a second series of second voltage ramps;
a first circuit configured to compare each first voltage ramp with a set point voltage and deliver a first signal representative of the comparison of said first voltage ramp with the set point voltage, and to compare each second voltage ramp with the set point voltage and deliver a second signal representative of the comparison of said second voltage ramp with the set point voltage;
a second circuit configured, based on the first and second signals, to:
    stop the first voltage ramp and start the second voltage ramp when said first voltage ramp reaches the set point voltage; and
    stop the second voltage ramp and start the first voltage ramp when said second voltage ramp reaches the set point voltage; and
a third circuit configured to modulate the set point voltage based on a maximum value of at least a last first voltage ramp in the first series compared with the set point voltage and based on a maximum value of at least a last second voltage ramp in the second series compared with the set point voltage;
wherein the third circuit is configured to generate a third signal alternately representative of a first difference between a reference voltage and the maximum value of at least said last first voltage ramp and of a second difference between the reference voltage and the maximum value of at least said last second voltage ramp, and to deliver the set point voltage alternately equal to the reference voltage minus the first difference and to the reference voltage minus the second difference.

11. The device according to claim 10, wherein:
the third circuit comprises a fourth circuit configured to update and store a first voltage representative of the maximum value of each first voltage ramp, between the end of each first voltage ramp and a next resetting of the first generator;
the third circuit comprises a fifth circuit configured to update and store a second voltage representative of the maximum value of each second voltage ramp, between the end of each second voltage ramp and a next resetting of the second generator; and
the second circuit is configured to control storage and the update based on the first and second signals.

12. The device according to claim 11, wherein:
the fourth circuit comprises a first series association of a capacitive element and of a switch, said first association being connected in parallel with a first capacitive element of the first generator, the first voltage being available across the capacitive element of the fourth circuit, the first voltage being updated by the turning-on of said switch and stored by the turning-off of said switch;
the fifth circuit comprises a second series association of a capacitive element and of a switch, said second series association being connected in parallel with a second capacitive element of the second generator, the second voltage being available across the capacitive element of the fifth circuit, the second voltage being updated by the turning-on of said switch and stored by the turning-off of said switch; and the second circuit is configured to control the switches of the fourth and fifth circuits based on the first and second signals.

13. The device according to claim 11, wherein the third circuit comprises:
   a first commutator having an input terminal configured to receive the first voltage and another input terminal configured to receive the second voltage; and
   an error amplifier having a first input configured to receive a signal representative of the reference voltage, a second input coupled to an output terminal of the first commutator and an output terminal configured to deliver the third signal, the first commutator being controlled by the second circuit based on the first and second signals.

14. The device according to claim 13, wherein the third circuit comprises a circuit for storing the reference voltage comprising:
   a capacitive element and a first switch coupling a node for delivering the reference voltage to a terminal of said capacitive element, the other terminal of said capacitive element being coupled to a node of application of a reference potential;
   another capacitive element and a second switch coupling a node of connection between said capacitive element and said first switch to a terminal of said other capacitive element, another terminal of said other capacitive element being coupled to the node of application of the reference potential; and
   the second circuit is configured to control the first and second switches of the circuit for storing based on the first and second signals.

15. The device according to claim 14, wherein said other terminal of said other capacitive element is coupled to the first input of the error amplifier by a second commutator, the second circuit being configured to control the second commutator similarly to the first commutator.

16. The device according to claim 10, wherein the third circuit comprises a third current source and a resistor series-connected between a node of application of a power supply voltage and a node of application of a reference potential, and a transistor connected in parallel with the resistor, a terminal for controlling the transistor being configured to receive the third signal.

17. A device, comprising:
   a first generator configured to generate a first series of first voltage ramps;
   a second generator configured to generate a second series of second voltage ramps;
   a comparison circuit configured to compare each first voltage ramp with a set point voltage and deliver a first signal representative of the comparison of said first voltage ramp with the set point voltage, and to compare each second voltage ramp with the set point voltage and deliver a second signal representative of the comparison of the second voltage ramp with the set point voltage; and
   a voltage generator circuit configured to generate said set point voltage, said voltage generator circuit configured to modulate the set point voltage to alternately have a first value based on a maximum value of at least a last first voltage ramp in the first series compared with the set point voltage and have a second value based on a maximum value of at least a last second voltage ramp in the second series compared with the set point voltage;
   wherein said voltage generator circuit is configured to generate a first difference signal indicative of a difference between the maximum value of at least the last first voltage ramp and a reference voltage and then generate the first value of the set point voltage equal to the reference voltage minus the first difference signal, and configured to generate a second difference signal indicative of a difference between the maximum value of at least the last second voltage ramp and the reference voltage and then generate the second value of the set point voltage equal to the reference voltage minus the second difference signal.

* * * * *